United States Patent [19]
de Wit et al.

[11] Patent Number: 5,353,028
[45] Date of Patent: Oct. 4, 1994

[54] DIFFERENTIAL FUSE CIRCUIT AND METHOD UTILIZED IN AN ANALOG TO DIGITAL CONVERTER

[75] Inventors: Michiel de Wit, Dallas, Tex.; Khen-Sang Tan, Singapore, Singapore

[73] Assignee: Texas Instruments Incorporated, Dallas, Tex.

[21] Appl. No.: 882,775

[22] Filed: May 14, 1992

[51] Int. Cl.$^5$ .............................................. H03M 1/38
[52] U.S. Cl. .................................... 341/172; 323/315
[58] Field of Search ............... 341/172, 155, 158, 161, 341/163, 133, 135, 136; 337/283, 284

[56] References Cited

U.S. PATENT DOCUMENTS

| | | | |
|---|---|---|---|
| 4,364,006 | 12/1982 | Makabe et al. | 323/353 |
| 4,399,426 | 8/1983 | Tan | 341/172 |
| 4,608,530 | 8/1986 | Bacrania | 323/315 |

*Primary Examiner*—Brian K. Young
*Attorney, Agent, or Firm*—Ira S. Matsil; James C. Kesterson; Richard L. Donaldson

[57] ABSTRACT

A differential fuse circuit 10 is disclosed herein. A first fuse 12 and a second fuse 14 are coupled to a supply potential $V_{DD}$ (e.g., five volts). Circuitry 16 and 18 for blowing the two fuses 12 and 14 is also provided. A current mirror 46 including a first leg and a second leg is also provided. The current mirror 46 is designed so that a current through the first leg will induce a current in the second leg. The first leg is coupled between the first fuse 12 and a reference potential $V_{SS}$ and the second leg is coupled between the second fuse 14 and the reference potential $V_{SS}$. An output node 56 is provided between the second fuse 14 and the second leg of the current mirror 46. A differential sense circuit 24 may also be included between the fuses 12 and 14 and the current mirror 46. During operation, the output node is at a potential substantially near the reference potential when the first fuse has a resistance greater than the second fuse and the output node is at a potential substantially near the supply potential when the first fuse has a resistance less than the second fuse. Other systems and methods are also disclosed.

30 Claims, 3 Drawing Sheets

DIFFERENTIAL FUSE CIRCUIT AND METHOD UTILIZED IN AN ANALOG TO DIGITAL CONVERTER

FIELD OF THE INVENTION

This invention generally relates to semiconductor devices and circuits and specifically to a differential fuse circuit and method.

BACKGROUND OF THE INVENTION

In the fabrication of electrical circuits, especially those formed in semiconductor integrated circuits, processing variations often prevent the manufacture of precise components, for example resistors and capacitors. Accordingly, there is a need for a method of trimming devices to obtain the precise values.

One circuit which requires precise accuracy of components (in this case capacitors) is a charge redistribution analog-to-digital (or digital-to-analog) converter. This circuit utilizes an array of binary weighted capacitors. The accuracy of the A/D converter is mainly determined by the matching of the capacitors in the array. Experimentally, it has been shown that in fabricating the capacitors utilizing MOS technology, acceptable ratio matching accuracies of up to 10 bits can be obtained with good yields. However, to achieve accuracy greater than 10 bits, external means such as laser trimming is required to change the size and value of the capacitors as required which, in turn, will increase the typical yield. However, laser trimming is a very expensive and time consuming procedure; to fabricate an A/D converter utilizing laser trimming techniques could cost more than an acceptable amount.

Another problem with laser trimming is that it must be performed at the wafer level before the device is packaged, while capacitor matching depends on stray capacitance induced by the proximity of the packaging material.

Fuses have also been used to aid in compensating variations in manufactured components. For instance, a fuse may be used to selectively connect additional elements to create the desired output. It is often desirable to set the values of the fuses (i.e., open or short) subsequent to packaging. In addition, if a large number of fuses are needed on one chip, it may not be possible to include bond pads to access each of the fuses. In this case, a transistor decoder is required and the fusing current is limited. As a result, fuses may be only partially blown, i.e., neither open nor short. This ambiguity creates a situation in which indeterminate logic outputs may be created thereby rendering the circuit useless (or at least less useful).

Accordingly, improvements which overcome any or all of the problems are presently desirable.

SUMMARY OF THE INVENTION

Other objects and advantages will be obvious, and will in part appear hereinafter and will be accomplished by the present invention which provides a differential fuse circuit and method.

A differential fuse circuit is disclosed herein. A first fuse and a second fuse are coupled to a supply potential (e.g., five volts). Circuitry for blowing the two fuses is provided. A current mirror including a first leg and a second leg is also provided. The current mirror is designed so that a current through the first leg will induce a current in the second leg (but not vice versa). The first leg is coupled between the first fuse and a reference potential and the second leg is coupled between the second fuse and the reference potential. An output node is provided between the second fuse and the second leg of the current mirror. A differential sense circuit may also be included between the fuses and the current mirror. During operation, the output node is at a potential substantially near the reference potential when the first fuse has a resistance greater than the second fuse and the output node is at a potential substantially near the supply potential when the first fuse has a resistance less than the second fuse.

One advantage of the present invention is that a fuse does not need to be fully blown (i.e., have a near infinite resistance) in order for the proper logic value to be obtained.

In addition, the circuit is easily realizable using presently known integrated circuit fabrication techniques.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENT

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the circuit and method of the present invention. The preferred embodiment will be described first followed by a description of modifications. The method of using the invention will then be described.

Figure 1:
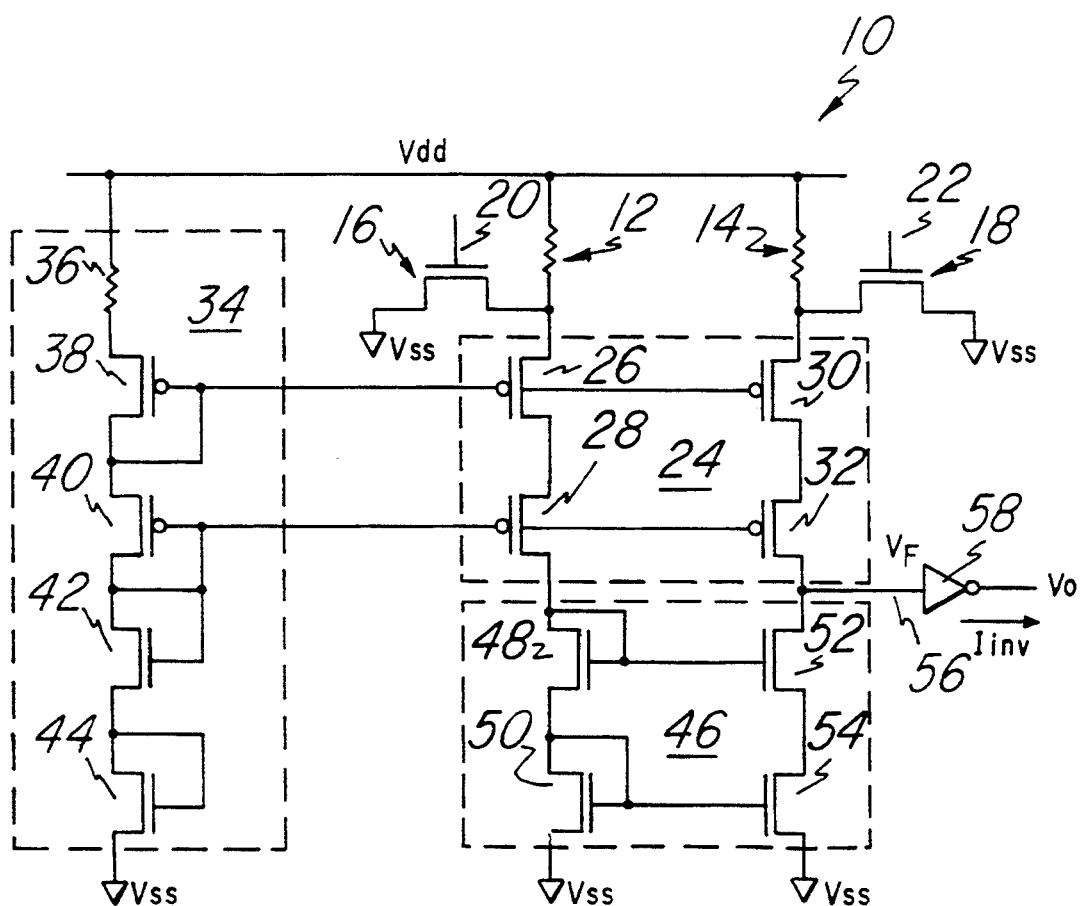
FIG. 1 is schematic of the preferred embodiment circuit.

Referring first to FIG. 1, a preferred embodiment circuit 10 is illustrated. The circuit includes a first fuse 12 and a second fuse 14. In the preferred embodiment, the fuses 12 and 14 comprise polysilicon fuses and are formed on an insulator (e.g., silicon dioxide) in an integrated circuit configuration. The resistors have a nominal value between 50Ω and 300Ω and preferably are between 100Ω and 200Ω. These values are chosen so that with a five to seven volt supply, transistors 16 or 18 can supply 5 to 10 mA to the fuses 12 or 14. One of the terminals of each of the fuses 12 and 14 are coupled to a supply potential $V_{DD}$.

Associated with each fuse 12 and 14 is a circuit (e.g., transistors 16 and 18) for blowing the fuse 12 and 14 respectively. In the illustrated case, the circuitry for blowing comprises a transistor, in this case an N-channel metal oxide semiconductor (NMOS) transistor (or in general any insulated gate field effect transistor). The transistor 16 is coupled to the terminal of the fuse 12 opposite the supply potential $V_{DD}$. When the voltage applied to the gate 20 exceeds the threshold of the transistor 16, current will flow from the supply voltage $V_{DD}$ through fuse 12 and through the transistor 16 to the reference potential $V_{SS}$. If the current exceeds some threshold, the fuse 12 will be blown, i.e., the resistance of the fuse will be raised (ideally to an infinite value). The same type of effect occurs for fuse 14 and transistor 18.

One of the advantages of the present invention is that the fuse does not need to fully blown in order for the current output to occur as will be explained in further detail below.

Coupled to the fuses 12 and 14 is a differential sense circuit 24 (which also includes current mirror circuit 46). In the illustrated example, the differential sense circuit 24 comprises a first leg which includes transistors 26 and 28 and a second leg which includes transistors 30 and 32. Transistors 26 and 30 are matched as are transistors 28 and 32. In the preferred embodiment, the transistor in the sense circuit 24 are all p-channel MOS (PMOS) transistors. FIG. 1 illustrates two transistors in each leg, however, more or less may be used depending upon the desired gain. In fact, it may be possible to exclude the sense circuit 24 entirely if the difference in resistance between fuses 12 and 14 is great enough. Stacking devices gives the differential sense circuit a high gain which in turn enables the circuit to determine smaller resistance differences. In the preferred embodiment, however, no more than four transistors can be used due to the fact that the threshold values are a little over 1 volt and the rail-to-rail voltage is about 5 volts.

Coupled to sense circuit 24 is a bias circuit 34. The bias circuit comprises a resistor 36 coupled to the supply potential $V_{DD}$. The resistor 36 is typically between 50Ω and 300Ω and preferably about 200Ω. Coupled in series with resistor 36 is P-channel MOS transistors 38 and 40. Each of the transistors has its gate coupled to it's source. The gate of transistor 36 is also coupled to the gates of transistors 26 and 30 and the gate of transistor 40 is coupled to the gates of transistors 38 and 32. This connection is for establishing the source of current flow in the two legs of circuit 24. This bias current is typically set at about 5 to 10 μA by matching transistor 38 to transistors 26 and 30 and by matching transistor 40 to transistors 28 and 32.

Connected in series between PMOS transistor 40 and a reference potential $V_{SS}$ are N-channel MOS transistors 42 and 44. These transistors 42 and 44 also have their gates coupled to the source. In the preferred embodiment, the bias circuit is designed to draw about 10 μA of current during operation. In this example, the width to length ratios (W/L) for transistors 38 and 40 are 22/1.5 and for transistors 42 and 44 the W/L is 7/1.5.

In the preferred embodiment, the threshold voltage of the PMOS transistors is about 0.77 volts, and the threshold voltage of the NMOS transistors is about 1.0 volts.

A current mirror circuit 46 is also provided. The current mirror circuit 46 comprises a first leg coupled between the first leg of the differential sense circuit 24 and the reference potential $V_{SS}$ and also comprises a second leg coupled between the second leg of the differential sense circuit 24 and the reference potential $V_{SS}$.

The current mirror circuit is designed such that a current flowing in the first leg will induce a current in the second leg.

In the preferred embodiment, the first leg of the current mirror circuit 46 comprises a first NMOS transistor 48 coupled in series with a second NMOS transistor 50. The gate of the first transistor 48 is coupled to the source of the transistor 48. Likewise, the gate of the second transistor 50 is coupled to the source of transistor 50. The second leg of the current mirror 46 comprises NMOS transistors 52 and 54 coupled in series. The gate of transistor 52 is coupled to the gate of transistor 48 and the gate of transistor 54 is coupled to the gate of transistor 50. Typically, transistors 42, 48 and 52 are matched as are transistors 44, 50 and 54.

The output node 56 is taken at the node between the second leg of the differential sense circuit 34 and the second leg of the current mirror circuit 46. In other words, the output node 56 is between the source of PMOS transistor 32 and the source of NMOS transistor 52.

An inverter 58 is also preferably included. The input of inverter 56 is coupled to node 56 and an output voltage $V_o$ can be sampled at the output of inverter 58. The inverter 58 is included to reach the desired logic levels.

Figure 2:
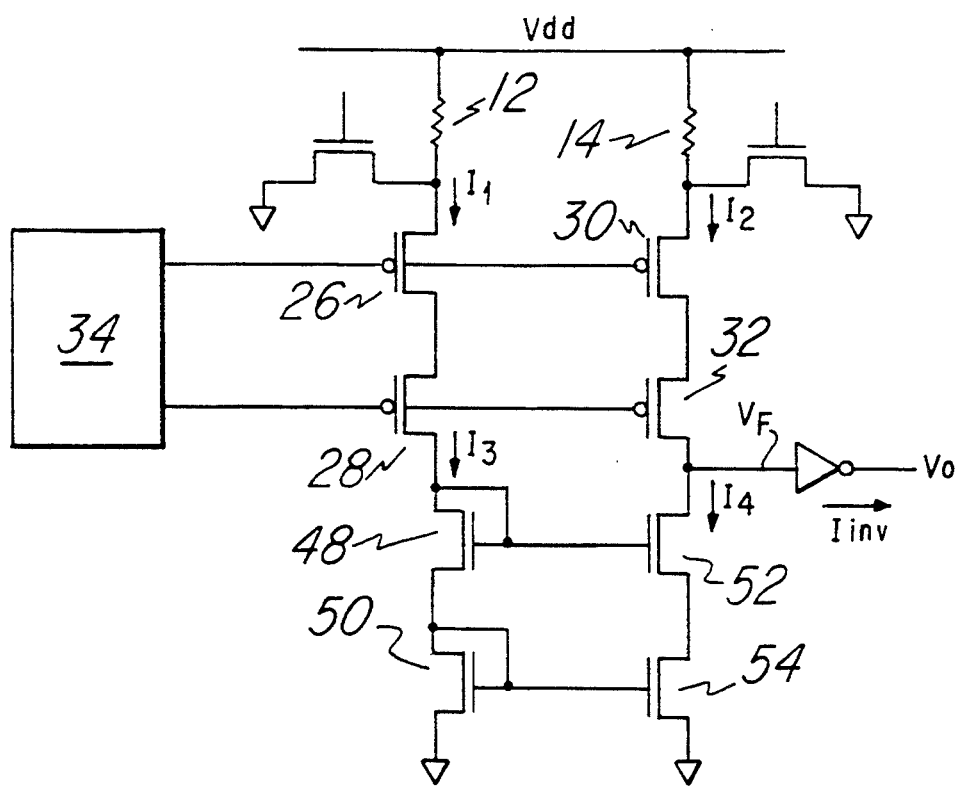
FIG. 2 is a simplified schematic of the circuit.

The basic operation of the circuit will now be explained with reference to FIG. 2 along with FIG. 1. When fuse 12 is blown (i.e., has a greater resistance than fuse 14), the current $I_1$ in the first leg of the differential sense circuitry is substantially off and therefore so is the current $I_3$ in the first leg of the current mirror 46. The current $I_4$ through the second leg of the current mirror 46 will also be off due to the current mirror effect. The P-channel transistors 26–32, however, will remain conducting because of the bias circuit 34, and therefore, the voltage $V_F$ at node 56 will be substantially equal to the supply voltage $V_{DD}$ (less any voltage drop across fuse 14 and/or transistors 30 and 32). In other words, the voltage $V_F$ will be pulled high, and the output voltage $V_O$ will be pulled low.

In the second situation, when the fuse 14 is blown, the currents $I_1$ and $I_3$ remain on, but the current $I_2$ in the second leg of the differential sense circuit turns off (since fuse 14 is blown). The current $I_4$ in the second leg of the current mirror is turned on by the current mirror effect (since the current $I_3$ is on), and therefore the voltage $V_F$ is substantially equal to the reference voltage $V_{SS}$. In other words, the voltage $V_F$ is low and the output voltage $V_O$ is pulled high.

Figure 3:
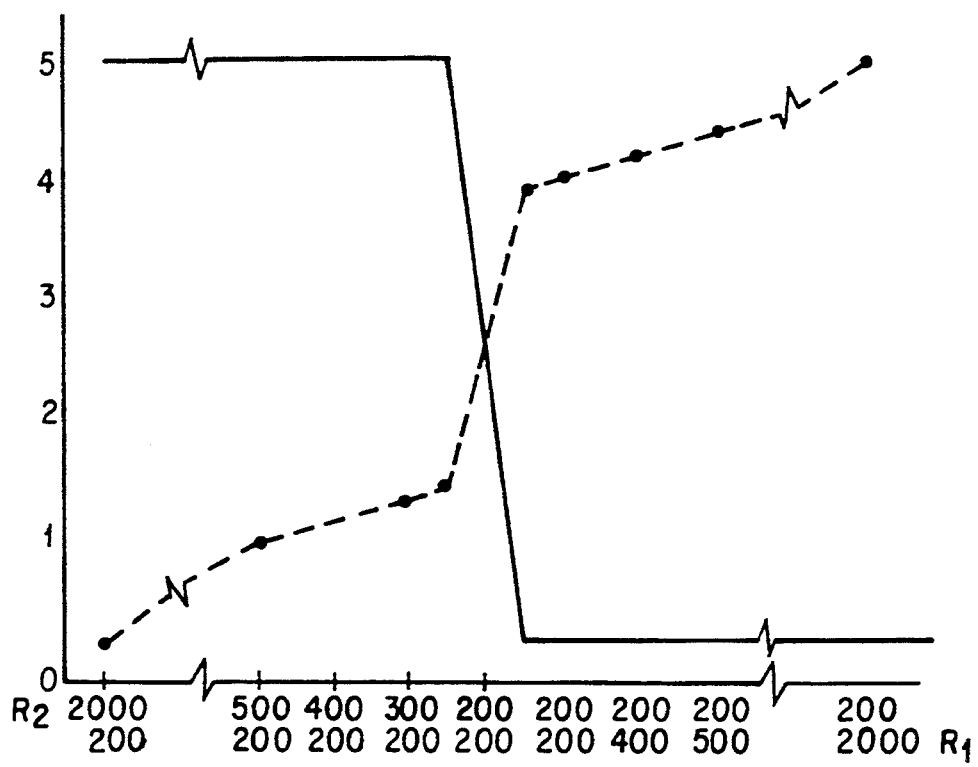
FIG. 3 is a plot of the results of a SPICE simulation of the circuit of FIG. 1 for various fuse resistance values and FIG. 4 illustrates a portion of an analog-to-digital converter circuit which uses a fuse circuit of the present invention.

The preceding example assumed that the fuses 12 and 14 each blow completely. That is, the blown fuse has an infinite resistance. However, it is difficult to ensure that this is the case. The graph in FIG. 3 illustrates the results of a SPICE simulation which was run to determine the effectiveness of the circuit when a fuse is only partially blown, i.e., when the resistance is somewhere between the nominal resistance and infinite resistance. In this simulation, it is assumed that the fuses have an initial resistance of 200 ohms and that only one of the fuses is blown so that one of the two fuses will always have 200Ω resistance. The circuit values were adjusted so that with a supply voltage $V_{DD}$ of five volts, the bias leg draws 10 μA of current (3 μA at $V_{DD}$=4.5V and 0 μA at $V_{DD}$=4V). The drive voltage $V_{gs}$-$V_t$ of each FET is set at about 0.26 volts. A preferred circuit would use a temperature independent current source, and this would be mirrored into the N-channel FETs 42 and 44 of the bias leg.

The results of the SPICE simulation are tabulated in Table 1 and are graphed in FIG. 3.

TABLE 1

| R1 (Ω) | R2 (Ω) | $V_F$(V) | $V_O$(V) | $I_1$ (μA) | $I_2$ (μA) | $I_{inv}$ (μA) |
| --- | --- | --- | --- | --- | --- | --- |
| 2 Meg | 200 | 5.0 | 0 | 0.1 | 0.1 | 0 |
| 500 | 200 | 4.4 | 0 | 10 | 10 | 0 |
| 400 | 200 | 4.2 | 0 | 10 | 10 | 0 |
| 300 | 200 | 4.0 | 0 | 10 | 10 | 0.5 |
| 250 | 200 | 3.9 | 0 | 10 | 10 | 1.2 |
| 200 | 250 | 1.3 | 5 | 10 | 10 | 1.0 |
| 200 | 300 | 1.2 | 5 | 10 | 10 | 0.5 |
| 200 | 500 | 0.9 | 5 | 10 | 10 | 0 |
| 200 | 2 Meg | 0.0 | 5 | 10 | 0.1 | 0 |

In Table 1, R1 is the resistance of the first fuse 12, R2 is the resistance of the second fuse 14 and $I_{inv}$ is the current flowing through inverter 58. The other voltages and currents are defined in FIG. 2. The SPICE simulation data shows that about a 100 ohm difference in resistance between the two fuses 12 and 14 is sufficient to cause a logic "0" to "1" change at the output $V_0$. If the transistor 30 has an offset of $V_t$ relative to transistor 26, then that voltage is made up by an IR drop in fuse 14, and the result is that the curves illustrated in FIG. 3 are shifted. For example 10 mV offset would shift the curves about 1 kΩ (since R=10 Mv /10 μA=1 kΩ). But transistors 12 and 14 can be close together and cross coupled with multiple units so that the offset is reduced to between about two and five millivolts. If the bias transistor 38 has an offset relative to transistors 26 and 30 then the currents $I_1$ and $I_2$ are changed from the nominal. Aside from bias power, the power per data bit is 0 for logic "0" and 10 μA for a logic "1".

The circuit 10 solves the problem of partially blown fuses on integrated circuits. As long as a change of at least about 1 KΩ (or possibly less) is achieved, proper logic levels are obtained. Similarly, if during aging a fuse drops its resistance, the logic level will remain correct if the blown-to-unblown resistance is about 200 to 1000 ohms or more.

Using the fusible link circuits described herein, an A/D (analog-to-digital) converter with trimmable array capacitors can be formed. An example of an A/D converter which includes an array of error correcting capacitors is described in U.S. Pat. No. 4,399,426 issued Aug. 16, 1983 to Tan and incorporated herein by reference. The circuitry described in the '426 patent refers specifically to on-board self-calibration applications that occur each time the chip is powered up. Obviously, the present fuse circuits could only be used for one time calibrations. However, the concepts behind the calibration are basically the same.

Figure 4:
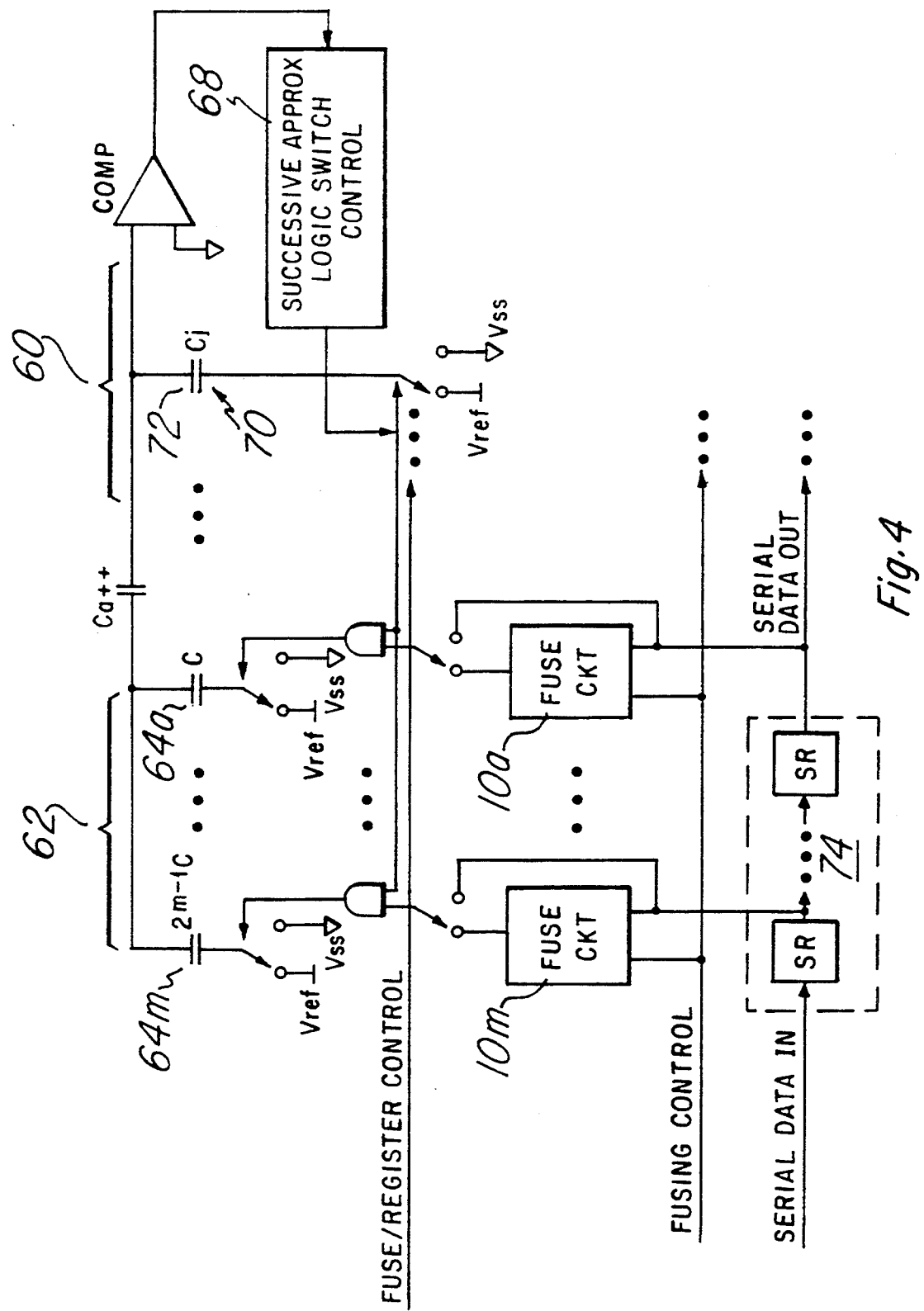

Referring now to FIG. 4, a portion of an A/D converter circuit is illustrated. A capacitor $C_j$ is one of a number of primary capacitors formed in the main capacitor array 60 of the A/D converter. Associated with the capacitor array 60 is a trim array 62. The trim array 62 comprises a set of binary weighted capacitors 64 which are switched together with the switching of $C_j$, provided they are selected by the associated fusing circuit 10. In this way, when the capacitor $C_j$ bottom plate 70 is switched from $V_{SS}$ (e.g., ground) to the reference voltage $V_{ref}$ by the successive approximation logic signal (generated by successive approximation logic switch control circuit 68), those capacitors 64 that are selected in the trim array will also switch. The result is that the changes in the voltage on the main array top plate 72 can be modified to give the desired value. The trim array voltage change is coupled to the main array, typically via an attenuation capacitor $C_{att}$ which sets the range of the trim. The resolution of the trim is set by the number of capacitors 64 in the trim array 62. During the actual trimming process a variety of corrections to the capacitor $C_j$ may be tried by controlling the trim capacitor selection from data in a shift register 74. Once proper trim has been decided on, the fusing is initiated and the fusing control and shift register control logic are deactivated with yet another fuse circuit so that no further changes are possible.

Both positive and negative trim can be made possible by reversing the polarity of the switching of the trim capacitor $2^{m-1}C$.

Although the only specific application of the fuse circuit of the present invention has been related to A/D converters, the invention may be applied to a great number of other situations. Specifically, the invention can be used in digital-to-analog converters, field programmable gate arrays and other field programmable application specific circuits as well as other circuits which require fuses.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A differential fuse circuit comprising:
   a first fuse coupled to a supply potential;
   a second fuse coupled to said supply potential;
   circuitry for blowing said first fuse coupled to said first fuse;
   circuitry for blowing said second fuse coupled to said second fuse; and
   a current mirror comprising a first leg and a second leg wherein a current through said first leg will induce a current in said second leg, said first leg coupled between said first fuse and a reference potential and said second leg coupled between said second fuse and said reference potential wherein said first leg of said current mirror comprises at least one first NMOS transistor and said second leg of said current mirror comprises at least one second NMOS transistor wherein the gate of said first NMOS transistor is coupled to the source of said first NMOS transistor and also to the gate of said second NMOS transistor.

2. The circuit of claim 1 wherein said supply potential is about five volts greater than said reference potential.

3. The circuit to claim 1 and further comprising an inverter with an input coupled between said second fuse and said second leg of said current mirror.

4. The circuit of claim 1 and further comprising a differential sense circuit including a first leg and a second leg wherein said first leg of said differential sense circuit is coupled between said first fuse and said first leg of said current mirror and said second leg of said differential sense circuit is coupled between said second fuse and said second leg of said current mirror.

5. The circuit of claim 4 wherein said first leg of said differential sense circuit comprises at least one first PMOS transistor and said second leg of said differential sense circuit comprises at least one second PMOS transistor wherein the gate of said first NMOS transistor and the gate of said second NMOS transistor are coupled to a bias circuit.

6. The circuit of claim 1 wherein said circuitry for blowing comprises a transistor.

7. The circuit of claim 1 wherein an output node is taken between said second fuse and said second leg of said current mirror whereby said output node is at a potential substantially near said reference potential when said first fuse has a resistance greater than said second fuse and said output node is at a potential substantially near said supply potential when said first fuse has a resistance less than said second fuse.

8. The circuit of claim 1 wherein said first and second fuses comprises polysilicon fuses.

9. A differential fuse circuit comprising:
   a first fuse and a second fuse each coupled to a supply potential;
   circuitry for blowing said first fuse coupled to said first fuse;
   circuitry for blowing said second fuse coupled to said second fuse;
   a differential sense circuit including a first field effect transistor coupled to said first fuse and a second field effect transistor coupled to said second fuse;
   a bias circuit, an output of said bias circuit coupled to a gate of said first field effect transistor and to a gate of said second field effect transistor;
   a current mirror circuit comprising a third field effect transistor coupled between said first field effect transistor and a reference potential and a fourth field effect transistor coupled between said second field effect transistor and said reference potential wherein a current flowing through said third field effect transistor will induce a current in said second field effect transistor; and
   an inverter, an input of said inverter coupled between said second field effect transistor and said fourth field effect transistor whereby an output of said inverter is at a potential substantially near said reference potential when said first fuse has a resistance less than said second fuse and said output node is at a potential substantially near said supply potential when said first fuse has a resistance greater than said second fuse.

10. The circuit of claim 9 wherein said first and second transistors comprise p-channel transistors.

11. The circuit of claim 10 wherein said third and fourth transistors comprise n-channel transistors.

12. The circuit of claim 11 and further comprising:
   a fifth p-channel transistor coupled between said first transistor and said third transistor;
   a sixth p-channel transistor coupled between said second transistor and said fourth transistor;
   a seventh n-channel transistor coupled between said third transistor and said reference potential; and
   an eighth n-channel transistor coupled between said fourth transistor and said reference potential.

13. The circuit of claim 9 wherein said bias circuit comprises:
   a resistor coupled to said supply potential;
   a first bias transistor, a drain of said first bias transistor coupled to said resistor and a gate of said first bias transistor coupled to said gate of said first transistor and to said gate of said second transistor and a source of said first bias transistor; and
   a second bias transistor, a gate of said second bias transistor coupled to a source of said second bias transistor and a drain of said second bias transistor coupled to said reference potential.

14. The circuit of claim 13 wherein said first bias transistor comprises an PMOS transistor an said second bias transistor comprises an NMOS transistor.

15. A method of forming a fuse comprising the steps of:
   providing a first fuse and a second fuse each coupled to a supply potential;
   providing circuitry for blowing said first fuse coupled to said first fuse;
   providing circuitry for blowing said second fuse coupled to said second fuse;
   providing a current mirror, said current mirror including a first leg and a second leg wherein a current flowing in said first leg will induce a current in said second leg, said first leg coupled between said first fuse and a reference potential and said second leg coupled between said second fuse and said reference potential; and
   blowing one of said first fuse or said second fuse such that an output node between said second fuse and said second leg of said current mirror is at a potential substantially near said reference potential when said first fuse has a resistance greater than said second fuse and such that said output node is at a potential substantially near said supply potential when said first fuse has a resistance less than said second fuse.

16. The circuit of claim 15 wherein said first and second fuses comprises polysilicon fuses.

17. The circuit of claim 16 wherein said first and second fuses each have a resistance between about 100 and 200 ohms prior to said blowing step.

18. The method of claim 15 wherein said supply potential is about five volts greater than said reference potential.

19. The circuit of claim 15 and further comprising the step of providing an inverter coupled to said output node.

20. An analog-to-digital converter circuit comprising:
   an array of primary capacitors connected in parallel, each said primary capacitors comprising a top plate and a bottom plate;
   a comparator including an input coupled to said primary capacitor top plate;
   an array of binary weighted error correcting capacitors, each said error correcting capacitors comprising a top plate and a bottom plate, said top plate of said error correcting capacitors coupled to said top plate of said primary capacitors through an attenuation capacitor;
   an array of fuse circuits, each said fuse circuits associated with one of said error correcting capacitors and coupled to said associated error correcting capacitor through a switch, each said fuse circuits comprising:
   first and second fuses coupled to a supply potential;
   a current mirror comprising a first leg and a second leg wherein a current through said first leg will induce a current in said second leg, said first leg coupled between said first fuse and a reference potential and said second leg coupled between said second fuse and said reference potential; and
   an output node between said second fuse and said second leg of said current mirror whereby said output node is at a potential substantially near said reference potential when said first fuse has a resistance greater than said second fuse and said output node is at a potential substantially near said supply potential when said first fuse has a resistance less than said second fuse; and a successive approximation logic switch control circuit for generating a successive approximation logic signal such that each of said error correcting capacitors is selectively switched to obtain a desired capacitor value on said primary capacitor top plate.

21. A differential fuse circuit comprising:

a first fuse having first and second terminals, said first terminal coupled to a supply potential;

circuitry for blowing said first fuse coupled to said first fuse;

a second fuse having first and second terminals, said first terminal coupled to said supply potential;

circuitry for blowing said second fuse coupled to said second fuse; and a current mirror comprising a first leg and a second leg wherein a current through said first leg will induce a current in said second leg, said first leg coupled between said second terminal of said first fuse and a reference potential and said second leg coupled between said second terminal of said second fuse and said reference potential.

22. The circuit of claim 21 wherein an output node is defined between said second fuse and said second leg of said current mirror whereby said output node is at a potential substantially near said reference potential when said first fuse has a resistance greater than said second fuse and said output node is at a potential substantially near said supply potential when said first fuse has a resistance less than said second fuse.

23. The circuit of claim 21 wherein said first leg of said current mirror comprises at least one first MOS transistor and said second leg of said current mirror comprises at least one second MOS transistor wherein the gate of said first MOS transistor is coupled to the source of said first MOS transistor and also to the gate of said second MOS transistor.

24. The circuit of claim 21 and further comprising a differential sense circuit including a first leg and a second leg wherein said first leg of said differential sense circuit is coupled between said first fuse and said first leg of said current mirror and said second leg of said differential sense circuit is coupled between said second fuse and said second leg of said current mirror.

25. The circuit of claim 24 wherein said first leg of said differential sense circuit comprises at least one first PMOS transistor and said second leg of said differential sense circuit comprises at least one second PMOS transistor wherein the gate of said first NMOS transistor and the gate of said second NMOS transistor are coupled to a bias circuit.

26. The circuit of claim 21 wherein said first and second fuses comprises polysilicon fuses.

27. The circuit of claim 23 wherein said first and second MOS transistors comprise NMOS transistors.

28. A differential fuse circuit comprising:

a first fuse coupled to a supply potential;

a second fuse coupled to said supply potential;

circuitry for blowing said first fuse coupled to said first fuse;

circuitry for blowing said second fuse coupled to said second fuse; and a current mirror comprising a first leg and a second leg wherein a current through said first leg will induce a current in said second leg, said first leg coupled between said first fuse and a reference potential and said second leg coupled between said second fuse and said reference potential wherein the difference between said reference potential and said supply potential is about five volts.

29. A differential fuse circuit comprising:

a first fuse coupled to a supply potential;

a second fuse coupled to said supply potential;

circuitry for blowing said first fuse coupled to said first fuse;

circuitry for blowing said second fuse coupled to said second fuse;

a current mirror comprising a first leg and a second leg wherein a current through said first leg will induce a current in said second leg, said first leg coupled between said first fuse and a reference potential and said second leg coupled between said second fuse and said reference potential; and an inverter coupled between said second fuse and said second leg.

30. A differential fuse circuit comprising:

a first fuse coupled to a supply potential, said first fuse having an initial resistance between about 100 and 200 ohms;

a second fuse coupled to said supply potential, said second fuse having an initial resistance between about 100 and 200 ohms;

circuitry for blowing said first fuse coupled to said first fuse;

circuitry for blowing said second fuse coupled to said second fuse;

a current mirror comprising a first leg and a second leg wherein a current through said first leg will induce a current in said second leg, said first leg coupled between said first fuse and a reference potential and said second leg coupled between said second fuse and said reference potential.

* * * * *